(12) United States Patent
Yang et al.

(10) Patent No.: US 10,108,188 B2
(45) Date of Patent: Oct. 23, 2018

(54) DATA PROCESSING DEVICE AND AERIAL VEHICLE

(71) Applicant: SZ DJI TECHNOLOGY CO., LTD., Shenzhen (CN)

(72) Inventors: Kang Yang, Shenzhen (CN); Guyue Zhou, Shenzhen (CN); Lei Yu, Shenzhen (CN); Xin Gao, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 90 days.

(21) Appl. No.: 15/426,087

(22) Filed: Feb. 7, 2017

(65) Prior Publication Data

US 2017/0146998 A1    May 25, 2017

Related U.S. Application Data

(63) Continuation of application No. PCT/CN2014/083946, filed on Aug. 8, 2014.

(51) Int. Cl.
| | |
|---|---|
| *G05D 1/00* | (2006.01) |
| *B64C 39/02* | (2006.01) |
| *H04N 5/378* | (2011.01) |
| *H03K 19/177* | (2006.01) |
| *H04N 5/376* | (2011.01) |

(Continued)

(52) U.S. Cl.
CPC ......... *G05D 1/0038* (2013.01); *B64C 39/024* (2013.01); *H03K 19/0016* (2013.01); *H03K 19/018507* (2013.01); *H03K 19/1774* (2013.01); *H03K 19/17716* (2013.01); *H04N 5/378* (2013.01); *H04N 5/3765* (2013.01); *B64C 2201/146* (2013.01)

(58) Field of Classification Search
None
See application file for complete search history.

(56) References Cited

U.S. PATENT DOCUMENTS

| 2005/0007163 | A1  | 1/2005 | Nair et al. |
| 2007/0182456 | A1* | 8/2007 | Agarwal ............ H03K 19/1732 |
| | | | 326/101 |

FOREIGN PATENT DOCUMENTS

| CN | 1574672 A | 2/2005 |
| CN | 101101742 A | 1/2008 |

(Continued)

OTHER PUBLICATIONS

Japan Patent Office (JPO) Office Action for 2016528176 and translation dated Jun. 13, 2017 4 Pages.

(Continued)

*Primary Examiner* — Todd M Melton
(74) *Attorney, Agent, or Firm* — Anova Law Group, PLLC

(57) ABSTRACT

A data processing device and an aerial vehicle are provided. The device comprises a sensor, a processor, and a clock converter. A data signal output pin of the sensor is connected with a data signal input pin of the processor. The sensor comprises at least two clock output pins, each of which is connected with one of two input pins of the clock convert. An output pin of the clock converter is connected with a clock input pin of the processor. The dock converter is configured to convert clock signals input from various input pins into a single-ended clock signal, and output the single-ended clock signal to the processor through the output pin.

11 Claims, 2 Drawing Sheets

(51) Int. Cl.
*H03K 19/00* (2006.01)
*H03K 19/0185* (2006.01)

(56) References Cited

FOREIGN PATENT DOCUMENTS

| | | | |
|---|---|---|---|
| CN | 101465154 | A | 6/2009 |
| CN | 102707725 | A | 10/2012 |
| CN | 103257348 | A | 8/2013 |
| CN | 103454951 | A | 12/2013 |
| CN | 103823232 | A | 5/2014 |
| CN | 204089771 | U | 1/2015 |
| JP | 2001053813 | A | 2/2001 |
| JP | 2006521043 | A | 9/2006 |

OTHER PUBLICATIONS

The World Intellectual Property Organization (WIPO) International Search Report for PCT/CN2014/083946 dated Apr. 28, 2015 p. 1-7.

* cited by examiner

DATA PROCESSING DEVICE AND AERIAL VEHICLE

CROSS-REFERENCE TO RELATED APPLICATION

This is a continuation application of International Application No. PCT/CN2014/083946, Filed on Aug. 8, 2014, the entire contents of which are incorporated herein by reference.

TECHNICAL FIELD

The present disclosure relates to the technical field of electronics, and in particular, to a data processing device and an aerial vehicle.

BACKGROUND OF THE DISCLOSURE

FPGA (Field-Programmable Gate Array) is a semi-custom integrated circuit. The user can program a FPGA into a desired digital integrated circuit chip by programming. FPGA is optimal for digital signal interfaces due to the flexibility.

LVDS (Low Voltage Differential Signaling) interface based data communication is widely used in devices including image sensors for its high data transmission rate, low noise and low power consumption. Two clock output channels are provided for LVDS: a positive and a negative differential clock signal ends.

When processing data with an FPGA and LVDS, one LVDS link can occupy one PLL and one pair of dedicated clock pins of FPGA. FIG. 1 shows a connection according to existing technologies by which only one image sensor can be connected to an FPGA which has only one pair of dedicated clock pins. If two LVDS differential clock signals are input respectively, the FPGA can perform a fusion calculation to obtain a clock signal for sampling the input data signal. The data signal can be sampled based on the clock signal.

The PLL and dedicated clock pins are limited resources of a FPGA. The prior connection of a link having dual clock signals with clock pins of an FPGA limits a number of sensors, which have dual clock signals such as cameras, to be connected to a FPGA.

SUMMARY OF THE DISCLOSURE

The present disclosure provides a data processing device and an aerial vehicle. An increased number of sensors can be connected to an FPGA.

In accordance with the present disclosure, there is provided a data processing device comprising a sensor, a clock converter, and processor. The sensor is configured to sense a data signal and comprises a data signal output pin configured to output the data signal, and at least two clock output pins configured to output clock signals. The clock converter is configured to convert the clock signals output by the sensor into a single-ended clock signal. The clock converter comprises input pins and an output pin. Each of the at least two clock output pins of the sensor is connected with one of the input pins and the input pins are configured to receive the clock signals front the at least two clock output pins. The output pin is configured to output the single-ended clock signal. The processor is configured to process the data signal based on the single-ended clock signal. The processor comprises a data signal input pin connected with the data signal output pin and configured to receive the data signal, and a clock input pin connected with the output pin of the clock convener and configured to receive the single-ended clock signal.

In some embodiments, the sensor is a differential clock signal based sensor and the clock signals are differential clock signals. A negative differential clock signal end of the sensor is connected with a first one of the input pins of the clock convener. A negative differential clock signal end of the sensor is connected with a second one of the input pins of the clock converter.

The clock converter is configured to convert the differential clock signals output by the sensor into the single-ended clock signal, and output the single-ended clock signal to the processor.

In some embodiments, a distance between the negative differential clock, signal, end of the sensor and the first one of the input pins of the clock converter is larger than a distance between the output pin of the clock converter and the clock input pin of the processor, and or a distance, between the negative differential clock signal end of the sensor and the second one of the input pins of the clock converter is larger than the distance between the output pin of the clock converter and the clock input pin of the processor.

In some embodiments, the sensor is an image sensor having a low voltage differential signaling interface and the processor comprises a field-programmable gate allay (FPGA).

In some embodiments, the device further comprises a data executor comprising a data input pin connected with a data output pin of the processor. The data executor is configured to respond to data processed by the processor and input from the data input pin.

Also in accordance with the present disclosure, there is provided an aerial vehicle comprising a sensor, a clock converter, and a processor. The sensor is configured to sense a data signal during a flight of the aerial vehicle and comprising a data signal output pin configured to output the data signal and at least two clock output pins configured to output clock signals. The clock converter is configured to convert the clock signals output by the sensor into a single-ended clock signal. The clock converter comprises input pins and an output pin. Each of the at least two clock output pins of the sensor is connected with one of the input pins and the input pins are configured to receive the clock signals from the at least two clock output pins. The output pin is configured to output the single-ended clock signal. The processor is configured to process the data signal based on the single-ended clock signal. The processor comprises a data signal input pin connected with the data signal output pin and configured to receive the data signal, and a clock input pin connected with the output pin of the clock convener and configured to receive the single-ended clock signal.

In some embodiments, the sensor is a differential clock signal based sensor and the clock signals are differential clock signals. A negative differential clock signal end of the sensor is connected with a first one of the input pins of the clock convener. A negative differential clock signal end of the sensor is connected with a second one of the input pins of the clock converter. The clock convener is configured to convert the differential clock signals output by the sensor into the single-ended clock signal, and output the single-ended clock signal to the processor.

In some embodiments, a distance between the negative differential clock signal end of the sensor and the first one of the input pins of the clock converter is larger than a distance between the output pin of the clock converter and the clock input pin of the processor, and/or a distance between the negative differential clock signal end of the sensor and the second one of the input pins of the clock converter is larger than the distance between the output pin of the clock converter and the clock input pin of the processor.

In some embodiments, the sensor is an image sensor having a low voltage differential signaling interface and the processor comprises a field-programmable gate array (FPGA).

In some embodiments, the aerial vehicle further comprises a data executor comprising a data input pin connected with a data output pin of the processor. The data executor is configured to respond to data processed by the processor and input from the data input pin.

In some embodiments, the data executor is a flight controller, or a communication module for transmitting visual data.

With present disclosure, a processor comprising a single FPGA can be connected with an increased number of sensors without increasing a size, a weight and a cost of the processor. The sensor can be a sensor having two clock signals, such as an LVDS, or another sensor having multiple clock signals. A number of sensor to be connected to the processor can be increased with a low cost.

DETAILED DESCRIPTION OF THE EMBODIMENTS

Technical solutions of the present disclosure will be described with reference to the drawings. It be appreciated that embodiments as described in the disclosure are simple merely some rather than all of the embodiments of the present disclosure. Other embodiments, which are conceived by those having ordinary skills in the art on the basis of the disclosed embodiments without inventive efforts, should within the scope of the present disclosure.

A clock converter is used in present disclosure. The clock converter can process and convert two clock signals into one clock signal before the two clock signals are input to a processor comprising a FPGA. The one clock signal can then be input to the processor. For instance, for two LVDS differential clock signals, the clock converter can fuse and convert the positive signal LVDS_CLK_P and the negative signal LVDS_CLK_N of the differential clock signals to obtain one clock signal which is used to sample a data signal. The obtained one clock signal can be input to the FPGA.

Figure 1:
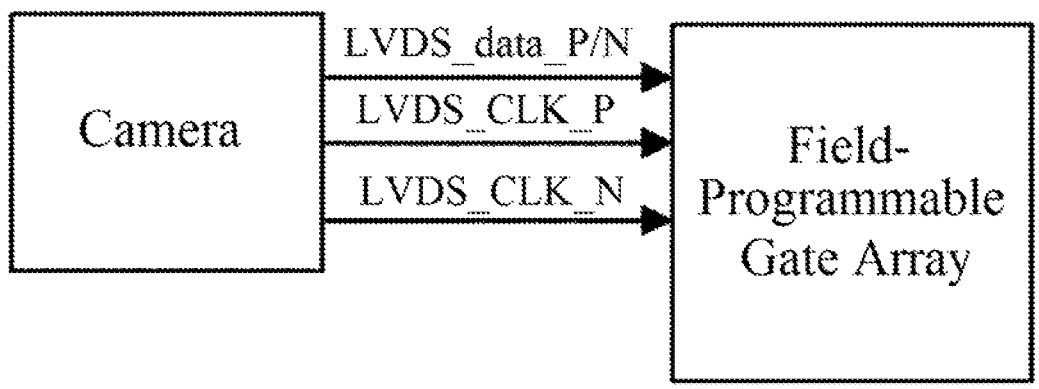
FIG. 1 is view showing an existing connection of a camera and a processor comprising a FPGA.
Figure 2:
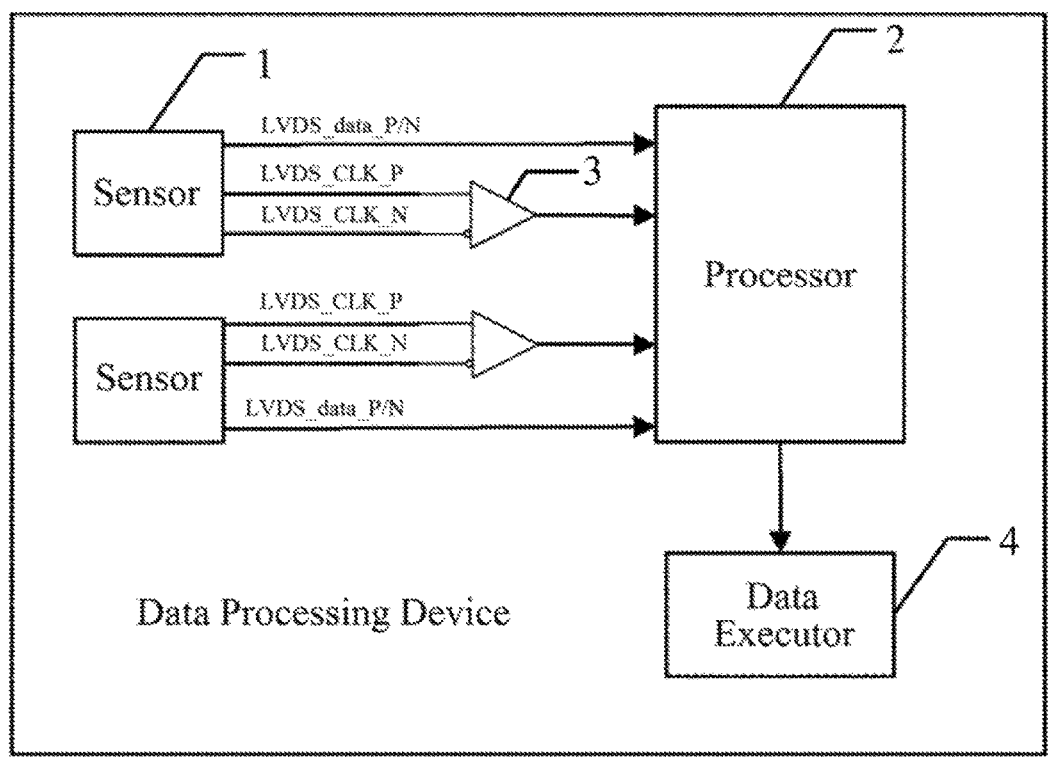
FIG. 2 is a schematic showing a data processing device according to an embodiment of the disclosure.

FIG. 2 is a schematic showing a data processing device according to an embodiment of the disclosure. The data processing device can be used in image capturing and processing. In some instances, the data processing device can be provided in an unmanned aerial vehicle to capture and process aerial photography images. Optionally, the data processing device can be provided in an apparatus such as a remotely controlled vehicle or a robot.

In some embodiments, the data processing device can comprise a sensor 1 for sensing a data signal, a processor 2 for processing the data signal based on a clock signal, and a clock converter 3. A data signal output pin of the sensor 1 can be connected with a data signal input pin of the processor 2. A first clock output pin of the sensor 1 can be connected with a first input pin of the clock converter 3. A second clock output pin of the sensor 1 can be connected with a second input pin of the clock converter 3.

An output pin of the clock converter 3 can be connected with a clock input pin of the processor 2.

The clock converter 3 can convert clock signals, which are input from the first input pin and the second input pin, into a single clock signal and output the single clock signal to the processor 2.

As shown in FIG. 2, in some embodiments, the sensor 1 can be an image sensor such as a camera, which is connected with the processor 2 via an LVDS interface. The processor 2 can be built based on an FPGA. In some embodiments, the processor 2 comprising an FPGA can comprise at least a pair of clock interfaces.

In some embodiments, the sensor 1 can be a differential clock signal based sensor 1. A negative differential clock signal end of the sensor 1 can be connected with the first input pin of the clock converter 3, and a negative differential clock signal end of the sensor 1 can be connected with a second input pin of the clock converter 3.

The clock converter 3 can convert the differential clock signals, which are output from the sensor 1, into a single clock signal and output the single clock signal to the processor 2. As shown in FIG. 2, LVDS_data_P/N is a data output interface of the sensor 1. The raw data signal, such as images captured by the sensor 1, can be output to the processor 2 via the LVDS_data_P/N output pin. The LVDS_CLK_P, which is a negative differential clock signal end, and LVDS_CLK_N, which is a negative differential clock signal end, can each transmit one differential clock signal to the clock converter 3.

The clock converter 3 can be a convener for convening a differential signal into a single-ended signal. The clock converter 3 can fuse two signals to obtain one clock signal, and supply the one clock signal to a clock pin of the processor 2. The processor 2 can sample the data signal received from the LVDS_data_P/N pin based on the one clock signal which is converted by the clock converter 3, such that a digital signal such as a digital image signal can be obtained. In some instances, the clock converter 3 can be a comparator which compares the two input clock signals. If a comparison result is greater than 0, then a signal having a level 1 can be output, and if the comparison result is less than or equal to 0, then a signal having a level 0 can be output.

It will be apparent that, in addition to a process of obtaining a digital data from raw data by data sampling, the processor 2 comprising a FPGA can be configured to implement various functions. For instance, the processor 2 can implement a function such as frame pixel compensation.

In some embodiments, a distance between the negative differential clock signal end of the sensor 1 and the first input pin of the clock converter 3 can be larger than a distance between the output pin of the clock converter 3 and the input pin of the processor 2. Additionally or alternatively, a distance between the negative differential clock signal end of the sensor 1 and the second input pin of the clock converter 3 can be larger than the distance between the output pin of the clock converter 3 and the input pin of the processor 2.

Because a jitter of the two LVDS differential clock signals is small and thus a generated interference is small, a length of a signal transmission line between the sensor 1 and the clock converter 3 can be greater than a length of a signal transmission line between the clock converter 3 and the processor 2, such that a signal interference is decreased.

Optionally, the data processing device can comprise a data executor 4. A data input pin of the data executor 4 can be connected with a data output pin of the processor 2. The data executor 4 can respond to data which is processed by the processor 2 and input from the data input pin.

The data executor 4 can be a controller, a display, or a communication module. In some instances, after obtaining a desired digital signal, the processor 2 can send the digital signal to a controller, such that the controller can perform a corresponding control based on the digital signal. For instance, during a flight, the controller can control an obstacle avoidance based on an obstacle detected by the camera. Optionally, after obtaining a desired digital signal, the processor 2 can send the digital signal to a display, such that the display can resolve and display, an image corresponding to the digital signal. Optionally, after obtaining a desired digital signal, the processor 2 can send the digital signal to a communication module, such that the communication module can send the digital signal to a corresponding user terminal.

With present disclosure, a processor 2 comprising a single FPGA can be connected with more sensors 1 without increasing a size, a weight, or a cost of the processor 2. The sensor 1 can be a sensor having two clock signals, such as an LVDS, or another sensor having multiple clock signals. A number of sensors 1 to be connected to the processor 2 can be increased with a low cost.

The present disclosure further provides an aerial vehicle including a fixed-wing aerial vehicle, rotor-wing aerial vehicle and so on. In some embodiments, the aerial vehicle can comprise a sensor, a processor and a clock converter.

The sensor can sense a data signal during a flight of the aerial vehicle.

The processor can process the data signal based on a clock signal.

A data signal output pin of the sensor can be connected with a data signal input pin of the processor.

The sensor can comprise at least two clock output pins, each of which can be connected with one input pin of the clock converter.

An output pin of the clock converter can be connected with a clock input of the processor.

The clock converter can convert clock signals, which are input from respective input pins, into a single-ended clock signal, and output the single-ended clock signal to the processor through the output pin.

In some instances, the sensor can be a differential clock signal based sensor.

A negative differential clock signal end of the sensor can be connected with a first input pin of the clock converter.

A negative differential clock signal end of the sensor can be connected with a second input pin of the clock converter.

The clock converter can convert the differential clock signal, which is output from the sensor, into a single-ended clock signal, and output the single-ended clock signal to the processor.

In some instances, a distance between the negative differential clock signal end of the sensor and the first input pin of the clock converter can be larger than a distance between the output pin of the clock converter and the input pin of the processor; and/or a distance between the negative differential clock signal end of the sensor and the second input pin of the clock converter can be larger than the distance between the output pin of the clock converter and the input pin of the processor.

In some instances, the sensor can comprise an image sensor having a low voltage differential signaling interface. The processor can be a processor comprising a field-programmable gate array (FPGA).

In some instances, the aerial vehicle can comprise a data executor.

A data input pin of the data executor can be connected with a data output pin of the processor.

The data executor can respond to the data which is processed by the processor and input from the data input pin.

In some instances, the data executor can be a flight controller. Optionally, the data executor can be a communication module for transmitting visual data.

A description of the data processing device of the embodiment described with reference to FIG. 2 can apply to an implementation of various components of the aerial vehicle.

With present disclosure, a processor comprising a single FPGA can be connected with an increased number of sensors without increasing a size, a weight and a cost of the processor. The sensor can have two clock signals such as LVDS or other multiple clock signals. A number of sensors to be connected to the processor can be increased and a function of the aerial vehicle can be expended with a low cost.

The disclosure is merely illustrative of the embodiments of the disclosure but not intended to limit the scope of the disclosure. Any equivalent modifications to a structure or process flow, which are made without departing from the specification and the drawings of the disclosure, and a direct or indirect application in other relevant technical fields, shall also fall into the scope of the disclosure.

What is claimed is:

1. A data processing device, comprising:
a sensor configured to sense a data signal and comprising:
a data signal output pin configured to output the data signal; and
at least two clock output pins configured to output clock signals;
a clock converter configured to convert the clock signals output by the sensor into a single-ended clock signal, the clock converter comprising:
input pins, each of the at least two clock output pins of the sensor being connected with one of the input pins, and the input pins being configured to receive the clock signals from the at least two clock output pins; and
an output pin configured to output the single-ended clock signal; and
a processor configured to process the data signal based on the single-ended clock signal, the processor comprising:
a data signal input pin connected with the data signal output pin and configured to receive the data signal; and
a clock input pin connected with the output pin of the clock converter and configured to receive the single-ended clock signal.

2. The device of claim 1, wherein:
the sensor is a differential clock signal based sensor and the clock signals are differential clock signals;
a negative differential clock signal end of the sensor is connected with a first one of the input pins of the clock converter;
a negative differential clock signal end of the sensor is connected a second one of the input pins of the clock converter; and the clock converter is configured to convert the, differential clock signals output by the, sensor into the single-ended clock signal, and output the single-ended clock signal to the processor.

3. The device of claim 2, herein:
a distance between the negative differential clock signal end of the sensor and the first one of the input pins of the clock convener is larger than a distance between the output pin of the clock converter and the clock input pin of the processor; and/or
a distance between the negative differential clock signal end of the sensor and the second one of the input pins of the clock convener is larger than the distance between the output pin of the clock converter and the clock input pin of the processor.

4. The device of claim 1, wherein:
the sensor is an image sensor having, a low voltage differential signaling interface; and
the processor comprises a field-programmable gate array (FPGA).

5. The device of claim further comprising:
a data executor, comprising:
    a data input pin connected with a data output pin of the processor,
    wherein the data executor is configured to respond to data processed by the processor and input from the data input pin.

6. An aerial vehicle, comprising:
a sensor configured to sense a data signal during a flight of the aerial vehicle and comprising:
    a data signal output pin configured to output the data signal; and
    at least two clock output pins configured to output clock signals;
a clock converter configured to convert the clock signals output by the sensor into a single-ended clock signal, the clock converter comprising:
    input pins, each of the at least two clock output pins of the sensor being connected with one of the input pins, and the input pins being configured to receive the clock signals from the at least two clock output pins; and
    an output pin configured to output the single-ended clock signal; and
a processor configured to process the data signal based on the single-ended clock signal, the processor comprising:
    a data signal input pin connected with the data signal output pin and configured to receive the data signal; and
    a clock input pin connected with the output pin of the clock convener and configured to receive the single-ended clock signal.

7. The aerial vehicle of claim 6, wherein:
the sensor is a differential clock signal based sensor and the clock signals are differential clock signals;
a negative differential clock signal end of the sensor is connected with a first one of the input pins of the clock converter;
a negative differential clock signal end of the sensor is connected with a second one of the input pins of the clock convener; and
the clock converter is configured to convert the differential clock signals output by the sensor into the single-ended clock signal, and output the single-ended clock signal to the processor.

8. The aerial vehicle of claim 7, wherein:
a distance between the negative differential clock signal end of the sensor and the first one of the input pins of the clock converter is larger than a distance between the output pin of the clock converter and the clock input pin of the processor; and/or
a distance between the negative differential clock signal end of the sensor and the second one of the input pins of the clock converter is larger than the distance between the output pin of the clock converter and the clock input pin of the processor.

9. The aerial vehicle of claim 6, wherein:
the sensor is an image sensor having a low voltage differential signaling interface; and
the processor comprises a field-programmable gate array (FPGA).

10. The aerial vehicle of claim 6, further comprising:
a data executor, comprising:
    a data input pin connected with a data output pin of the processor,
    wherein the data executor is configured to respond to data processed by the processor and input from the data input pin.

11. The aerial vehicle of claim 10, wherein the data executor is a flight controller, or a communication module for transmitting visual data.

* * * * *